United States Patent [19]

Trump

[11] Patent Number: 5,105,144
[45] Date of Patent: Apr. 14, 1992

[54] DRIVER FOR FIELD EFFECT TRANSISTOR

[75] Inventor: Ronald C. Trump, Clearwater, Fla.

[73] Assignee: Honeywell Inc., Minneapolis, Minn.

[21] Appl. No.: 649,095

[22] Filed: Feb. 1, 1991

[51] Int. Cl.$^5$ .............................................. G05F 1/56
[52] U.S. Cl. .................................. 323/283; 323/284
[58] Field of Search ............... 323/282, 283, 284, 285, 323/289; 304/296.1, 571; 320/9; 307/239, 270, 584

[56] References Cited

U.S. PATENT DOCUMENTS

| | | | |
|---|---|---|---|
| 4,420,700 | 12/1983 | Fay et al. | 323/282 |
| 4,521,725 | 6/1985 | Phaneuf | 323/282 |
| 4,553,082 | 11/1985 | Nesler | 307/270 |
| 4,733,159 | 3/1988 | Edwards et al. | 323/282 |
| 4,803,612 | 2/1989 | Skovmand | 323/284 |

*Primary Examiner*—Peter S. Wong
*Attorney, Agent, or Firm*—Seymour Levine; Donald J. Lenkszus; Albin Medved

[57] ABSTRACT

An MOS FET pass element for a switching voltage regulator is driven by a dual voltage booster configuration. The pulse width modulator of the regulator provides a two-phase logic signal for alternately energizing and charging each booster. Each booster is comprised of a capacitor charged from a charging voltage source and coupled to the gate of the FET for providing a turn-on voltage thereto. A switching transistor associated with each booster alternately couples the associated booster capacitor to a predetermined voltage and to ground. The capacitors alternately provide the turn-on voltage to the FET when the predetermined voltage is applied thereto. On alternate half cycles, each capacitor is charged from the charging voltage source. The two-phase logic signal alternately renders the switching transistors conductive. A NAND gate responsive to the two-phase logic signal, permits the FET to be turned on by the voltage boosters only during the presence of each of the logic signals.

4 Claims, 2 Drawing Sheets

DRIVER FOR FIELD EFFECT TRANSISTOR

The invention was made with United States Government funds and the United States has certain rights therein.

BACKGROUND OF THE INVENTION

1. Field of the Invention

The invention relates to drivers for Field Effect Transistors (FET), particularly of the Metal-Oxide-Semiconductor (MOS) power FET type (MOS FET). The invention has particular application in circuits where the FET source is not necessarily at a fixed voltage. Such applications include switching regulators for power supplies and power switches.

2. Description of the Prior Art

Present day power supplies traditionally utilize the switching regulator to provide voltage regulation and the MOS FET is often utilized as the pass element thereof. Generally, the N Channel FET exhibits superior "on" characteristics than the P Channel FET, thereby rendering the N Channel FET highly appropriate for use as the pass element in switching regulators. The low "on" resistance and zero gate current of the N Channel FET contribute to high efficiency of the regulator.

In order, however, to turn on the N Channel FET, a gate to source voltage of 10–15 volts is required. Thus, when the N Channel FET is utilized in a switching regulator, the gate must be driven to a potential 10 volts above the supply voltage. Prior art techniques to drive such devices in a switching regulator mode tend to be complex, costly and inefficient. Such prior art designs tend to utilize uncommon and expensive precision components, as well as additional power supplies to effect the drive voltage. Such designs tend to be awkward and are not readily integrated into a convenient monolithic Integrated Circuit (IC) format. The prior art designs generally operate over limited ranges of operating parameters such as primary supply voltage, operating frequency and temperature. Such prior art MOS FET drivers typically have undesirably large part counts and poor power efficiency.

For example, the prior art MOS FET driver designs include an auxiliary power supply 10 volts higher than the primary supply. This design tends to be expensive and inefficient. Another prior art design utilizes a floating 10 volt power supply referenced to the MOS FET source terminal. Such a design is very awkward and difficult to mechanize. A still further prior art design utilizes a remote power supply and such exotic components as an opto-coupler or an acoustic coupler. Another prior art design utilizes a transformer coupled signal to the gate that is referenced to the MOS FET source terminal. The capability of such an arrangement is limited to the particular design and/or application.

The MOS FET also has utility in power switches such as those utilized in space applications to conserve power by disconnecting non-critical subsystems from the power source. The drivers for such power switches suffer from the same disadvantages described above, with respect to the switching regulator.

SUMMARY OF THE INVENTION

The disadvantages of the prior art are obviated by a circuit for driving the gate of the FET with a turn-on voltage that is a predetermined voltage above the FET drain or source. A voltage source provides a first voltage less than the turn-on voltage and a chargeable voltage booster, coupled to the gate, provides a second voltage less than the turn-on voltage. The first voltage combined with the second voltage exceeds the turn-on voltage. Switching means switchably couples the voltage source to the booster so as to provide the turn-on voltage to the gate of the FET.

In a switching voltage regulator embodiment, the voltage source and two boosters are alternately utilized to turn the FET on. When the voltage source and one booster is turning on the FET, the other booster is charging.

DESCRIPTION OF THE PREFERRED EMBODIMENT

Figure 1:
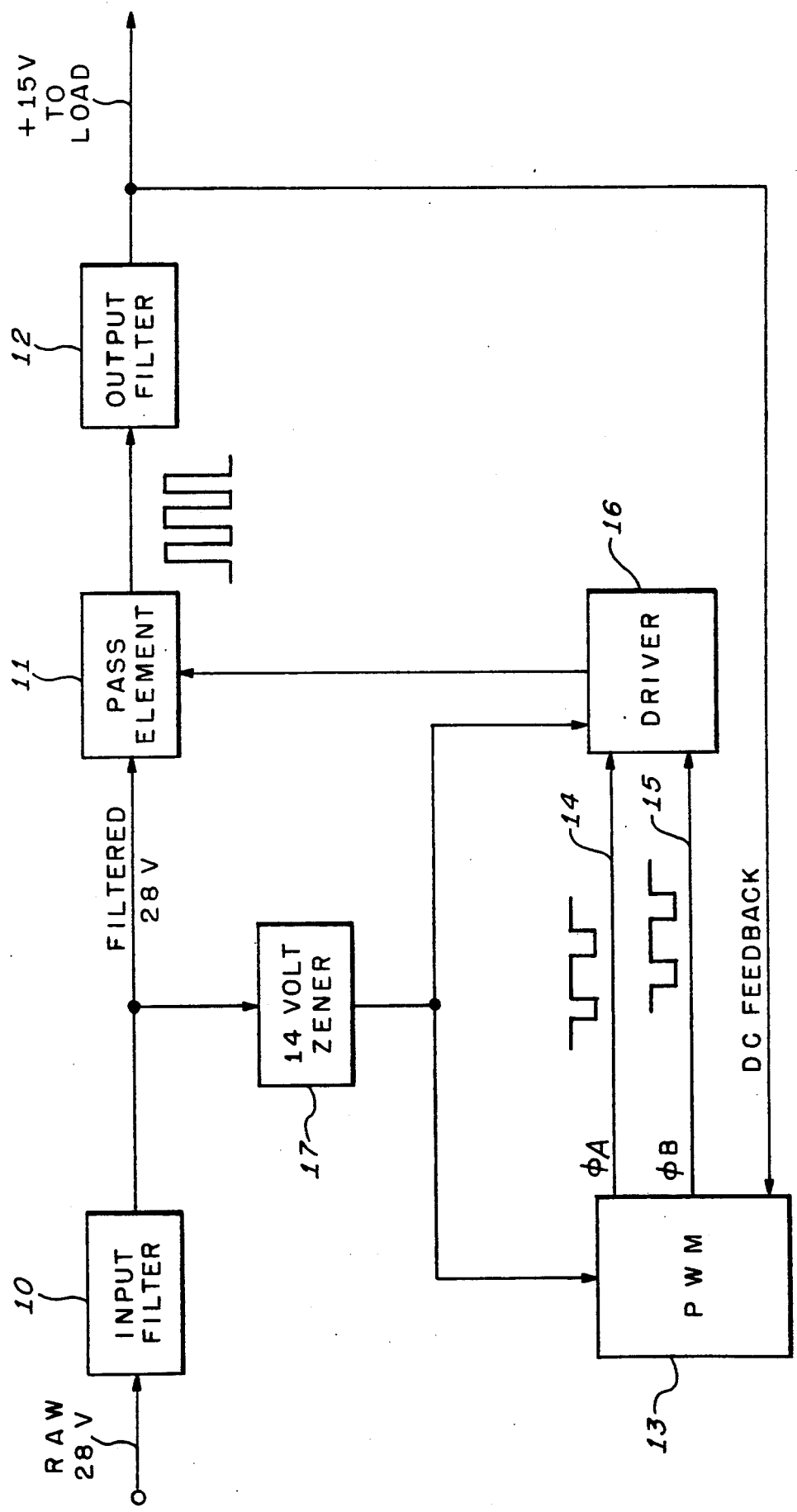
FIG. 1 is a schematic block diagram of a switching voltage regulator utilizing the driver of the present invention.

Referring to FIG. 1, a typical switching regulator is illustrated wherein the driver thereof is implemented in accordance with the present invention. Raw 28 volts is applied through an input filter 10 to provide filtered 28 volts. The filtered 28 volts is switchably coupled through a pass element 11 to an output filter 12. The output filter 12 provides the +15 volt output to the load. The pass element 11 pulse width modulates (PWM) the filtered 28 volts so as to provide the voltage regulation.

The power supply output from the output filter 12 is applied as a DC feedback signal to a pulse width modulator 13. The pulse width modulator 13 provides Phase A and Phase B signals on leads 14 and 15 to a driver 16. The driver 16 switchably turns the pass element 11 on and off, so as to pulse width modulate the filtered 28 volts in accordance with the Phase A and Phase B signals on the leads 14 and 15. The pulse width modulator 13 modulates the width of the pulses on the leads 14 and 15 in accordance with the DC feedback signal, so as to maintain a regulated voltage output from the output filter 12 irrespective of load. The PWM 13 is preferably implemented by an SG1524 which provides a 40 kHz, two Phase, pulse width modulated drive on the leads 14 and 15. Other known similar pulse width modulators may be utilized to the same effect.

A 14 volt Zener diode regulator 17, coupled to the filtered 28 volts, provides power for the PWM 13, as well as the charging voltage for boosters utilized in the driver 16. As previously described, the driver 16 is implemented in accordance with the present invention.

Figure 2:
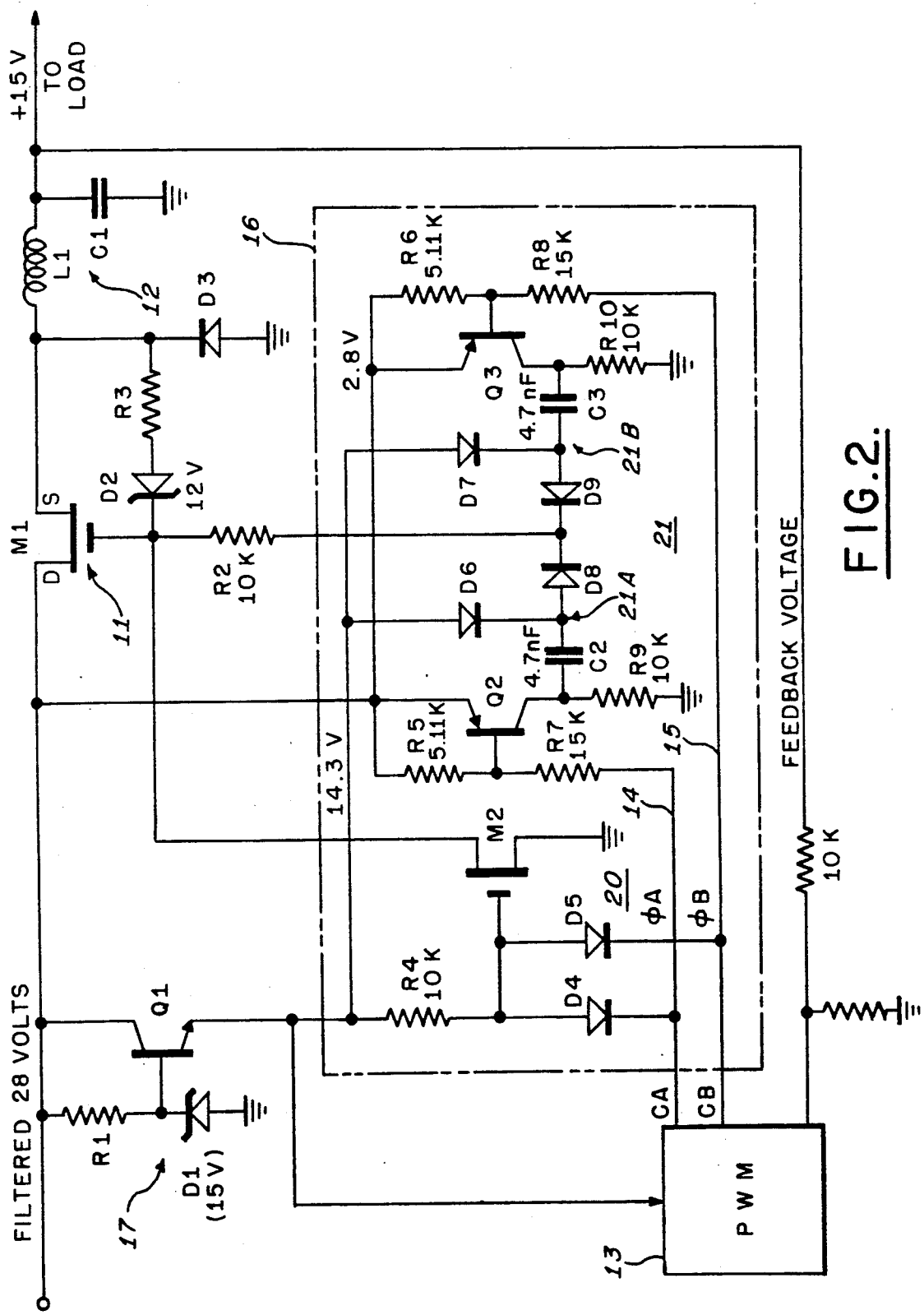
FIG. 2 is a schematic wiring diagram of the switching regulator of FIG. 1, illustrating details of the driver of the present invention.

Referring to FIG. 2, in which like reference numerals indicate like components with respect to FIG. 1, details of the switching regulator of FIG. 1 are illustrated. The Zener diode regulator 17 is comprised of a 15 volt Zener diode D1, a transistor Q1 and a resistor R1. The pass element 11 is comprised of an FET M1 together with a 12 volt Zener diode D2, a resistor R3 and a diode D3. The output filter 12 is comprised of an inductor L1 and a capacitor C1. The Phase A and Phase B pulse width modulated drive signals from the PWM 13 are denoted as CA and CB, respectively.

With respect to the invention, the driver 16 is comprised of a logical NAND gate 20 and a dual voltage booster 21. The NAND gate 20 is responsive to the Phase A and Phase B signals and the halves of the dual voltage booster 21 are designated as 21A and 21B. The NAND gate 20 is comprised of diodes D4 and D5, a resistor R4 and an FET M2. The 21A half of the dual voltage booster 21 is comprised of resistors R5 and R7, a transistor Q2, a capacitor C2, a resistor R9, and diodes D6 and D8. The 21B half of the dual voltage booster 21 is comprised of resistors R6 and R8, a transistor Q3, diodes D7 and D9, a capacitor C3 and a resistor R10. The transistors Q1, Q2 and Q3 are preferably implemented by 2N2907 transistors. The pass element FET M1 is preferably implemented by a 2N6764 and the NAND gate FET M2 is preferably implemented by a 2N6788. The diodes D4–D9 are preferably implemented by 1N4148 diodes.

The emitters of the transistors Q2 and Q3 receive the filtered 28 volts, and the boosters 21A and 21B are charged from a 14.3 volt line from the Zener regulator 17. The NAND gate 20 is coupled to the gate of the pass transistor M1 to enable and disable M1. The Phase A and Phase B signals (CA and CB) that drive the inputs of the NAND gate 20, are coupled to the respective bases of the transistors Q2 and Q3 to control the operations thereof. The junction between the diodes D8 and D9 provide the drive to the FET M1 through a resistor R2.

In operation, the PWM 13 alternately turns on the voltage boosters 21A and 21B to provide the required drive signal for the pass transistor M1. To turn the pass transistor M1 on in the configuration illustrated, the gate voltage should be 10 to 14 volts above the primary supply voltage as reflected back through the output filter 12 to the source of M1. This voltage is approximately 38 to 42 volts with respect to ground. When the MOS FET is switched on, the source voltage is approximately 0.5 volts below the drain voltage. The drain voltage is +28 and when the MOS FET is on, the source voltage is approximately +27.5 volts. Since the MOS FET 11 is the pass element in a switching regulator, it is either fully ON or fully OFF. This ON-OFF voltage is applied to the output filter 12 such that the DC output voltage, which is +15 volts in the described embodiment, is approximately the time average of the switched voltage at the input of the filter 12. To increase the output voltage, the ratio of ON time to OFF time is increased. Conversely, to decrease the output voltage, the ratio of ON time to OFF time is decreased. Output voltage control is effected by controlling the pass element ON time or pulse width. Since the operating frequency is fixed, the actual control is effected by the ratio of ON time to OFF time.

When CA and CB are both high, diodes D4 and D5 are reverse biased and the gate of M2 is at approximately 14 volts. The FET M2 is therefore conducting, pulling the gate of M1 to ground. The NAND gate 20 thus holds M1 off when CA and CB are high. When either CA or CB goes low, M2 is turned off thus permitting M1 to be turned on by the drive signals through R2. Internal logic in the PWM 13 prevents CA and CB from being low at the same time. If this condition were permitted to occur, proper switching of the transistors Q2 and Q3 and proper operation of the booster 21 would be disrupted. The NAND gate 20 is utilized to turn M1 off when a PWM pulse terminates.

As evident in FIG. 1 from the wave forms associated with the leads 14 and 15, the driver 16 operates in cycles with a Phase B negative going pulse occurring in the first half cycle, followed by a Phase A negative going pulse in the second half cycle. When CA or CB is high, the associated transistor Q2 or Q3 is held off. In response to the Phase A or Phase B negative going pulse, the associated transistor Q2 or Q3 is rendered conductive As described above with respect to FIG. 1, the width of the negative going Phase A and Phase B pulses are controlled in the PWM 13 to provide the desired voltage regulation in a well known manner. When Q2 is off, C2 charges to approximately 13.5 volts through D6 and R9. When Q2 is turned on, the collector thereof is pulled to approximately 28 volts and the combined collector voltage and voltage across C2 is applied through the diode D8 and the resistor R2 to the gate of M1. The same operations occur with respect to Q3 and the booster 21B.

Specifically, assume during the first half of a cycle, that CA is high and CB is low for a period of time determined by the PWM 13. The transistor Q3 is driven into saturation by the low CB signal and the collector thereof is approximately 0.2 volts below the filtered 28 volts. During the previous half cycle, the capacitor C3 had been charged to about 13.5 volts. The anode of D9, therefore, is approximately 13.5 volts above the collector of Q3, and the gate of M1 is approximately 12.5 volts above the primary supply voltage. This voltage applied to the gate of M1, is more than sufficient to maintain M1 fully conductive during the full cycle. During this half cycle, C2 is being charged via D6 and R9.

During the second half of the cycle, CB is high and CA is low for a period of time determined by the PWM 13. Thus, the transistor Q2 is saturated and the collector thereof is approximately 0.2 volts below the filtered 28 volts. The charge on C2 is such that the gate voltage applied to M1 is again approximately 12.5 volts above the primary supply voltage, assuring that M1 is conductive. During this half cycle, C3 is charged via D7 and R10.

The Zener diode D2 and resistor R3 prevent the gate-to-source voltage from exceeding the ratings of the transistor M1. When the voltage applied to the gate of M1 exceeds a predetermined safe limit, the Zener diode D2 exceeds the breakdown potential thereof, limiting the voltage between the gate and source of M1. The components D2 and R3 assure reasonable operation of the power supply in the event of very light loads, including an open circuit. This is because most switching regulators that utilize pulse width modulation techniques for control, do not control the output voltage if the load is very light (approximately 5% to 10% of the maximum). Under these conditions most regulators of this type exhibit some form of very undesirable oscillation which may destroy or damage parts connected to the regulator by applying an excess voltage thereto. In the present invention, however, R3 and D2 prevent the pass transistor from turning on except as required to maintain the output voltage near the desired value thereof. Although the output ripple voltage may increase by a factor of three, most applications can tolerate this condition.

Since the device described herein utilizes alternately operating dual boosters 21A and 21B, the device can also be utilized as a power switch by maintaining each booster on 51% of the time. This approach permits the pass element to remain on 100% of the time for as long as necessary. This action is similar to that of an electronic relay.

Although the invention was described in terms of utilizing alternately operating dual boosters 21A and 21B, it is appreciated that the invention may also be embodied with only one of the booster configurations 21A or 21B. Such an embodiment might be useful when M1 is never on for more than 75% of the time, or the ratio of ON time to OFF time never exceeds 75%.

The present invention provides improvements in power efficiency, as well as reduction in parts count over prior art designs. The design of the driver of the present invention is simple and hence inexpensive, efficient and readily integrated into a monolithic IC. All of the components are readily available and no precision or exotic parts, or additional power supplies are required. All of the components are inexpensive and operation is realizable over a wide range of operating conditions such as primary supply voltage, operating frequency and temperature. The driver 16 can be integrated with the PWM 13 to provide a compact combined circuit.

While the invention has been described in its preferred embodiment, it is to be understood that the words which have been used are words of description rather than limitation and that changes may be made within the purview of the appended claims without departing from the true scope and spirit of the invention in its broader aspects.

I claim:

1. A driver circuit for the gate of a Field Effect Transistor (FET), the FET having a source and drain at source and drain voltages, respectively, where a turn-on voltage for the FET is a predetermined voltage above one of said source and drain voltages, said FET being used as a pass element in a power supply switching voltage regulator, said switching voltage regulator including a pulse width modulation (PWM) circuit for providing first and second PWM signals which are out of phase with respect to each other, said PWM circuit varying the duty cycle of said first and second PWM signals to provide voltage regulation by turning said pass element on and off in accordance with said duty cycle, said driver comprising:

a first voltage source for providing a first voltage less than said turn-on voltage, first and second chargeable voltage boosters coupled to said gate, each said first and second chargeable voltage booster capable of charging to a boost voltage less than said turn-on voltage, said first voltage combined with said boost voltage exceeding said turn-on voltage, first switching means coupled to said first chargeable voltage booster and responsive to said first PWM signal alternately for coupling said first chargeable voltage booster to said first voltage source so as to combine said boost voltage with said first voltage to provide at least said turn-on voltage to said gate of said FET and for decoupling said first chargeable voltage booster from said first voltage source so as to permit said first chargeable voltage booster to charge to said boost voltage, and second switching means coupled to said second chargeable voltage booster and responsive to said second PWM signal alternately for coupling said second chargeable voltage booster to said first voltage source so as to combine said boost voltage with said first voltage to provide at least said turn-on voltage to said gate of said FET and for decoupling said second chargeable voltage booster from said first voltage source so as to permit said second chargeable voltage booster to charge to said boost voltage, said first switching means coupling said first chargeable voltage booster to said first voltage source in accordance with said duty cycle of said first PWM signal, said second switching means coupling said second chargeable voltage booster to said first voltage source in accordance with said duty cycle of said second PWM signal, said first and second PWM signals controlling said first and second switching means so that said second chargeable voltage booster is charging to said boost voltage when said first chargeable voltage booster is coupled to said first voltage source to provide said turn-on voltage to said gate of said FET and so that said first chargeable voltage booster is charging to said boost voltage when said second chargeable voltage booster is coupled to said first voltage source to provide said turn-on voltage to said gate of said FET.

2. The circuit of claim 1 wherein each said chargeable voltage booster comprises a charging voltage source, and a capacitor coupled to said charging voltage source and charged thereby, said capacitor being coupled to said gate of said FET for providing said turn-on voltage thereto.

3. The circuit of claim 2 wherein said first and second switching means comprises first and second transistors responsive to said first and second PWM signals, respectively, for switchably coupling said first voltage source to said capacitors of said first and second chargeable voltage boosters, respectively, in accordance with said duty cycle, said first and second PWM signals operative to alternately render said first and second transistors conductive so as to alternately provide said turn-on voltage from said capacitors of said first and second chargeable voltage boosters to said gate of said FET.

4. The circuit of claim 3 wherein said first and second PWM signals comprise alternately provided first and second logic signals coupled to said first and second transistors, respectively, for alternately rendering said first and second transistors conductive, said circuit further including a logic gate responsive to said logic signals and coupled to said gate of said FET for permitting said FET to turn on only when one of said first and second logic signals is present.

* * * * *